(12) United States Patent
Weil et al.

(10) Patent No.: US 10,840,929 B1
(45) Date of Patent: Nov. 17, 2020

(54) DIGITAL-TO-ANALOG CONVERTER (DAC) WITH COMMON-MODE CORRECTION

(71) Applicant: QUALCOMM Incorporated, San Diego, CA (US)

(72) Inventors: Andrew Weil, San Diego, CA (US); Jaswinder Singh, San Diego, CA (US); Debesh Bhatta, San Diego, CA (US); Haibo Fei, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/411,407

(22) Filed: May 14, 2019

(51) Int. Cl.
| | | |
|---|---|---|
| *H03M 1/06* | (2006.01) | |
| *H03M 1/10* | (2006.01) | |
| *H03M 1/66* | (2006.01) | |
| *H03M 1/74* | (2006.01) | |

(52) U.S. Cl.
CPC ....... *H03M 1/0604* (2013.01); *H03M 1/1009* (2013.01); *H03M 1/661* (2013.01); *H03M 1/742* (2013.01)

(58) Field of Classification Search
CPC .... H03M 1/0604; H03M 1/742; H03M 1/661; H03M 1/1009
USPC .......................................... 341/118, 144, 136
See application file for complete search history.

(56) References Cited

U.S. PATENT DOCUMENTS

| | | | | |
|---|---|---|---|---|
| 6,853,323 B1* | 2/2005 | Chen | .................. | H03M 1/0678 341/144 |
| 7,589,655 B2* | 9/2009 | Cheung | ............... | H03F 3/45183 341/144 |
| 8,922,412 B1* | 12/2014 | Gorman | .............. | H03M 1/0604 341/144 |
| 9,531,337 B2 | 12/2016 | Chen et al. | | |

OTHER PUBLICATIONS

Seo, D., et al., "A Pseudo differential Class AB DAC for Low-Power Wireless Transmitter," IEEE Transactions on Circuits and Systems I: Regular Papers, IEEE, US, vol. 56, No. 10, Oct. 1, 2009 (Oct. 1, 2009), pp. 2332-2340, XP011333540.

* cited by examiner

*Primary Examiner* — Khai M Nguyen
(74) *Attorney, Agent, or Firm* — Patterson + Sheridan, LLP

(57) ABSTRACT

Certain aspects of the present disclosure are directed to a digital-to-analog converter (DAC) system. The DAC system generally includes a first current-steering DAC having a positive output, a negative output, and a bypass output; a common-mode (CM) path coupled between the positive and negative outputs; and a CM current compensation path coupled to the CM path.

20 Claims, 12 Drawing Sheets

| code | MSB14 | MSB13 | MSB12 | MSB11 | MSB10 | MSB9 | MSB8 | MSB7 | MSB6 | MSB5 | MSB4 | MSB3 | MSB2 | MSB1 | MSB0 |
|------|-------|-------|-------|-------|-------|------|------|------|------|------|------|------|------|------|------|
| 0    | N     | N     | N     | N     | N     | N    | N    | N    | N    | N    | N    | N    | N    | N    | N    |
| 1    | BYP   | N     | N     | N     | N     | N    | N    | N    | N    | N    | N    | N    | N    | N    | N    |
| 2    | BYP   | BYP   | N     | N     | N     | N    | N    | N    | N    | N    | N    | N    | N    | N    | N    |
| 3    | BYP   | BYP   | BYP   | N     | N     | N    | N    | N    | N    | N    | N    | N    | N    | N    | N    |
| 4    | BYP   | BYP   | BYP   | BYP   | N     | N    | N    | N    | N    | N    | N    | N    | N    | N    | N    |
| 5    | BYP   | BYP   | BYP   | BYP   | BYP   | N    | N    | N    | N    | N    | N    | N    | N    | N    | N    |
| 6    | BYP   | BYP   | BYP   | BYP   | BYP   | BYP  | N    | N    | N    | N    | N    | N    | N    | N    | N    |
| 7    | BYP   | BYP   | BYP   | BYP   | BYP   | BYP  | BYP  | N    | N    | N    | N    | N    | N    | N    | N    |
| 8    | BYP   | BYP   | BYP   | BYP   | BYP   | BYP  | BYP  | P    | P    | P    | P    | P    | P    | P    | P    |
| 9    | BYP   | BYP   | BYP   | BYP   | BYP   | BYP  | P    | P    | P    | P    | P    | P    | P    | P    | P    |
| 10   | BYP   | BYP   | BYP   | BYP   | BYP   | P    | P    | P    | P    | P    | P    | P    | P    | P    | P    |
| 11   | BYP   | BYP   | BYP   | BYP   | P     | P    | P    | P    | P    | P    | P    | P    | P    | P    | P    |
| 12   | BYP   | BYP   | BYP   | P     | P     | P    | P    | P    | P    | P    | P    | P    | P    | P    | P    |
| 13   | BYP   | BYP   | P     | P     | P     | P    | P    | P    | P    | P    | P    | P    | P    | P    | P    |
| 14   | BYP   | P     | P     | P     | P     | P    | P    | P    | P    | P    | P    | P    | P    | P    | P    |
| 15   | P     | P     | P     | P     | P     | P    | P    | P    | P    | P    | P    | P    | P    | P    | P    |

DIGITAL-TO-ANALOG CONVERTER (DAC) WITH COMMON-MODE CORRECTION

TECHNICAL FIELD

Certain aspects of the present disclosure generally relate to electronic circuits and, more particularly, to a digital-to-analog converter (DAC).

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include radio frequency (RF) front-end circuitry. The RF front-end circuitry may include one or more digital-to-analog converters (DACs) for converting digital signals (that may be generated by a baseband module) to analog signals for amplification and signal transmission.

SUMMARY

Certain aspects of the present disclosure are directed to a digital-to-analog converter (DAC) system. The DAC system generally includes a first current-steering DAC having a positive output, a negative output, and a bypass output; a common-mode (CM) path coupled between the positive and negative outputs; and a CM current compensation path coupled to the CM path.

Certain aspects of the present disclosure are directed to a method for digital-to-analog conversion. The method generally includes selectively directing current flow in a positive output path, a negative output path, and a bypass path based on a DAC input code; generating a compensation current to reduce a CM current in the positive and negative output paths; and directing the compensation current to a CM path coupled between the positive and negative output paths.

Certain aspects of the present disclosure are directed to an apparatus for digital-to-analog conversion. The apparatus generally includes means for selectively directing current flow in a positive output path, a negative output path, and a bypass path based on a DAC input code and means for generating a compensation current to reduce a CM current component of the current flow in the positive and negative outputs, the compensation current being directed to a CM path between the positive and negative output paths.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

FIG. 5 is a diagram illustrating example switch positions of current sources set based on a DAC input code, in accordance with certain aspects of the present disclosure.

DETAILED DESCRIPTION

Certain aspects of the present disclosure are generally directed to a current-steering digital-to-analog converter (DAC) implemented with a bypass path.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" (or "coupled to") in the various tenses of the verb "connect" (or "couple") may mean that element A is directly connected (or coupled) to element B or that other elements may be connected between elements A and B (i.e., that element A is indirectly connected with element B). In the case of electrical components, the term "connected with" (or "coupled to") may also be used herein to mean that a wire, trace, or other electrically conductive material is used to electrically connect (coupled) elements A and B (and any components electrically connected (coupled) therebetween).

An Example Wireless System

Figure 1:
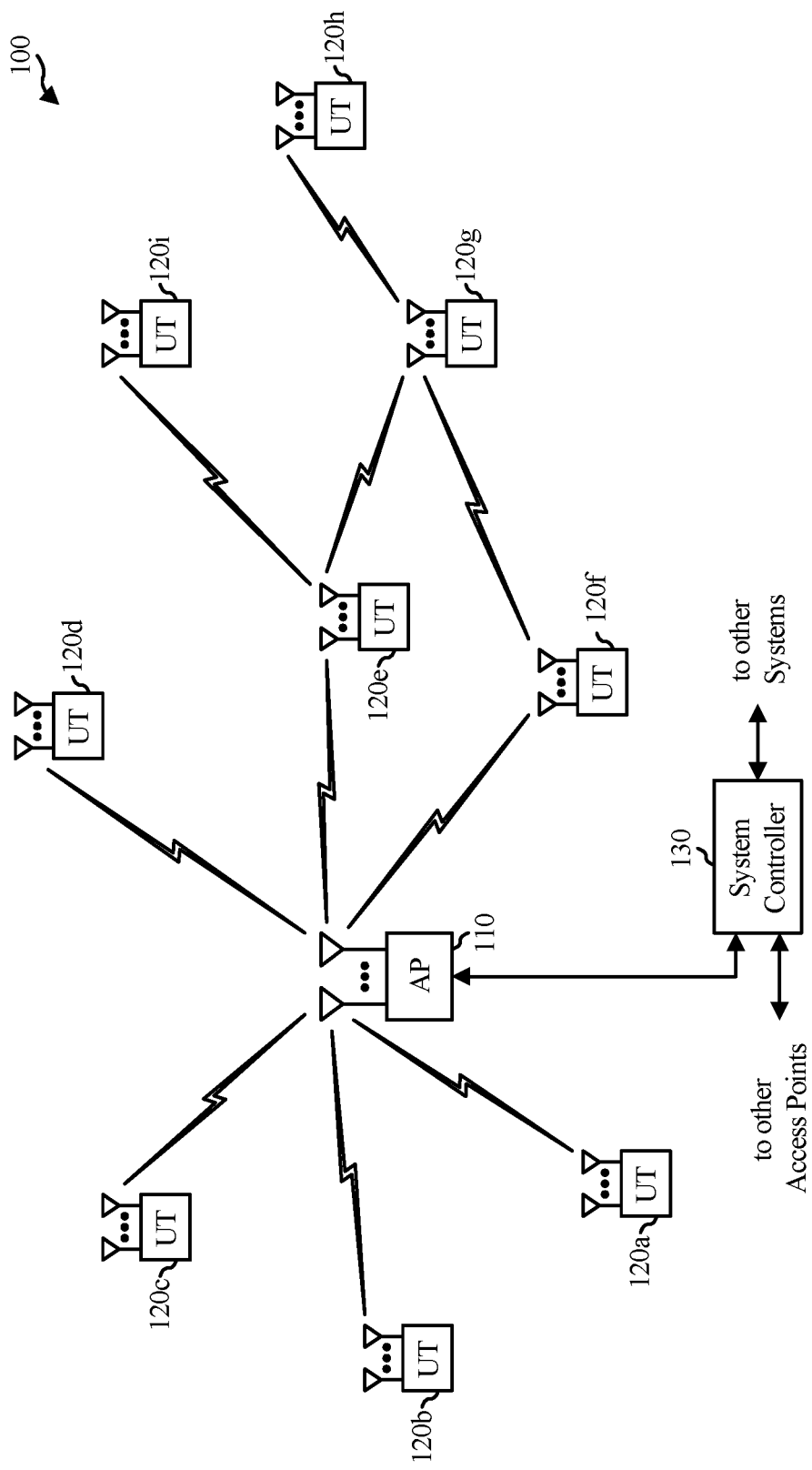
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e. $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include a digital-to-analog converter (DAC) implemented with common-mode (CM) current compensation, as described in more detail herein.

Figure 2:
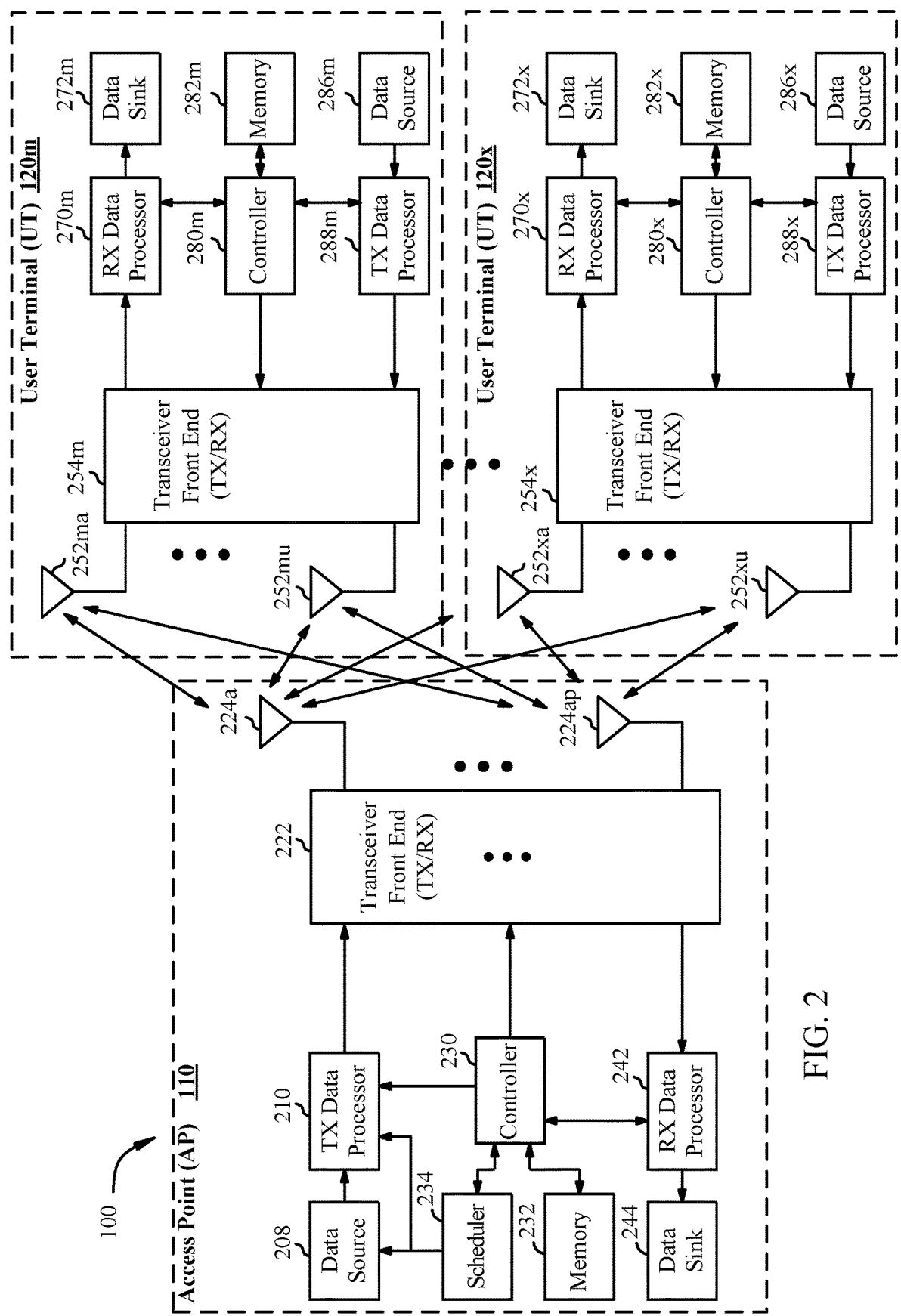
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include a DAC implemented with CM current compensation, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
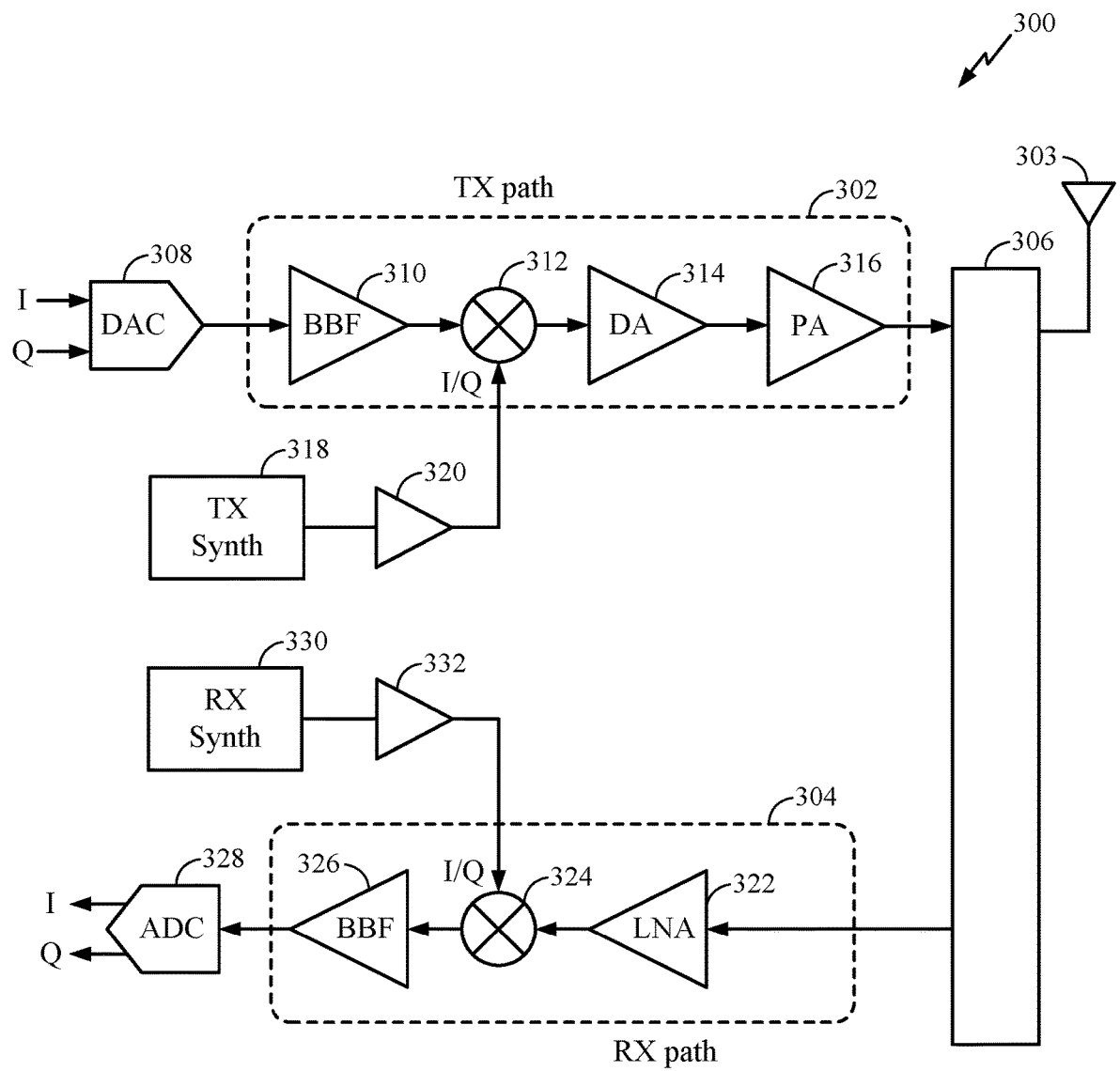
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a DAC 308, the TX path 302 may include a baseband filter (BBF) 310, a mixer 312, a driver amplifier (DA) 314, and a power amplifier (PA) 316. In certain aspects, the DAC 308 may be implemented with CM current compensation, as described in more detail herein. The BBF 310, the mixer 312, and the DA 314 may be included in a radio frequency integrated circuit (RFIC), while the PA 316 may be external to the RFIC. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically entails using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324.

While FIGS. 1-3 provide a wireless communication system as an example application in which certain aspects of the present disclosure may be implemented to facilitate understanding, certain aspects described herein may be used for digital-to-analog conversion in any of various other suitable systems (e.g., any electronic system).

Example Digital-to-Analog Converter (DAC) with Common-Mode Correction

A DAC, such as the DAC 308 described with respect to FIG. 3 above, may be implemented as a current-steering DAC, for example. Traditional current-steering DACs may be implemented using an array of current sources (e.g., switches and transistors) which are selectively coupled to either positive or negative outputs of the current-steering DAC based on a DAC input code. Based on a value of a digital input, the amount of current sourced (or sunk) from the positive and negative outputs is adjusted, indicating the value of the digital input. Each current source is either coupled to the negative output or the positive output, and therefore, contributes to the noise at the output of the DAC, resulting in a constant common-mode (CM) current at the output of the DAC.

Certain aspects of the present disclosure implement a current-steering DAC with a bypass path. For example, one or more of the current sources may be bypassed depending on the digital input of the DAC, reducing noise at the DAC output, and improving transmit path signal-to-noise ratio (SNR). However, implementing a current-steering DAC with a bypass path may result in a non-constant CM current at the DAC output which may be problematic for a baseband filter (BBF) (e.g., BBF 310) coupled to the output of the DAC. In other words, the CM current may be a function of the DAC input code since the number of current sources that are bypassed is dependent on the DAC input code. In certain aspects, each of the current sources of the current-steering DAC may be implemented using a switch array, as described in more detail with respect to FIG. 4.

Figure 4:
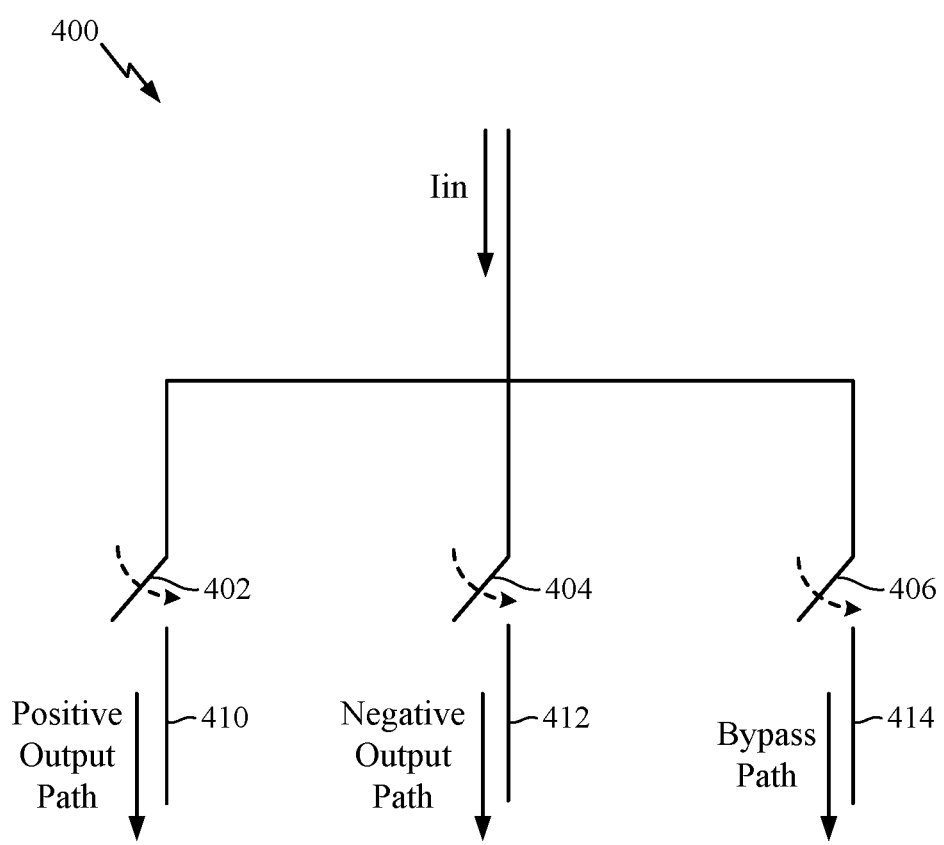
FIG. 4 illustrates an example switch array of a current-steering digital-to-analog converter (DAC) having a bypass path, in accordance with certain aspects of the present disclosure.

FIG. 4 illustrates an example switch array 400 of a current-steering DAC having a bypass path, in accordance with certain aspects of the present disclosure. As illustrated, switches 402, 404, 406 may be used to direct an input current (Iin) to either a positive output path 410, a negative output path 412, or a bypass path 414, based on a DAC input code. The bypass path current is the current that does not contribute to the differential current (e.g., current summation at the positive output of the PMOS DAC 702 minus the current summation at the negative output of the PMOS DAC 702) at the DAC output as set by the DAC input code. In certain aspects, each of the switches 402, 404, 406 may be implemented using a p-type metal-oxide-semiconductor (PMOS) transistor to form a PMOS DAC. The positive and negative output paths may be coupled to the positive and negative input terminals of a BBF, such as the BBF 310 described with respect to FIG. 3.

FIG. 5 is a diagram 500 illustrating example switch positions of current sources set based on a DAC input code, in accordance with certain aspects of the present disclosure. As illustrated, input current for a switch array assigned to each of the most-significant bits (MSBs) (e.g., MSB14 to MSB0) of a DAC digital input may be directed to either the negative output path, represented by "N" in diagram 500, the positive output path, represented by "P" in diagram 500, or the bypass path, represented by "BYP" in diagram 500. The switch array assigned to each of the MSBs may also be referred to as an MSB array. Thus, the number of current sources that are bypassed is dependent on the DAC input code, resulting in the non-constant CM current.

Figure 6:
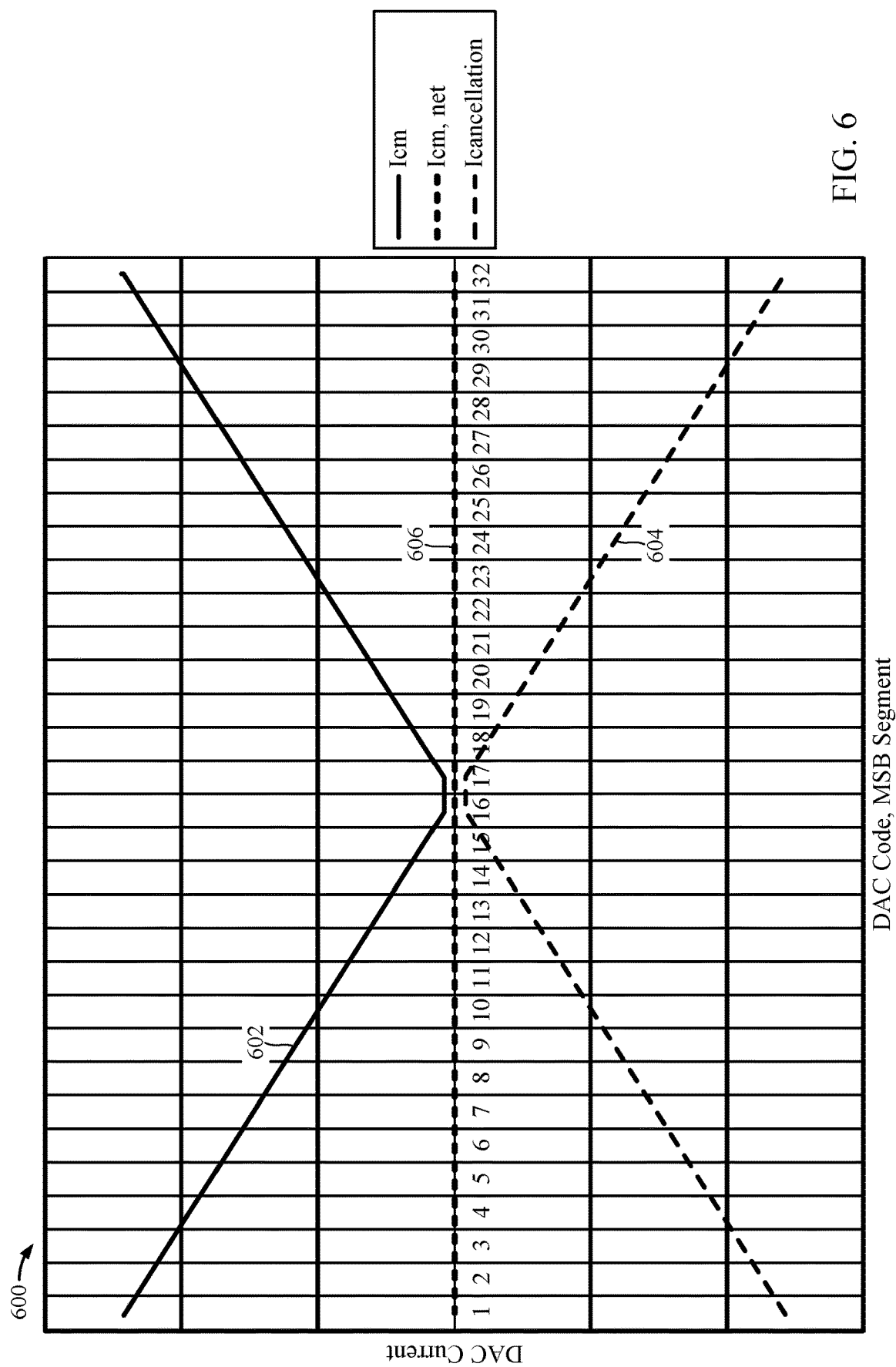
FIG. 6 is a graph illustrating a common-mode (CM) current of a current-steering DAC implemented using a bypass path, in accordance with certain aspects of the present disclosure.

FIG. 6 is a graph 600 illustrating a CM current of a current-steering DAC implemented using a bypass path, in accordance with certain aspects of the present disclosure. As presented above, implementing the bypass path results in a non-constant CM current that is dependent on the DAC input code. For example, as illustrated by graph 600, due to the differing number of switch arrays directing input current to a bypass path, the CM current 602 (Icm) is dependent on the DAC input code. In other words, the CM current may vary depending on the number of switch arrays being bypassed (e.g., directing input current to the bypass path). Certain aspects of the present disclosure are directed to generating a current (Icancellation) 604 to effectively cancel (or at least reduce) the code-dependent CM current 602 (Icm), resulting in an input code independent CM current 606 (Icm, net) for the current-steering DAC. As used herein, the term "compensation current" or "compensation path" generally refers to a current flow or path for at least reducing CM current, and should not to be interpreted as requiring complete cancellation of CM current.

Figure 7:
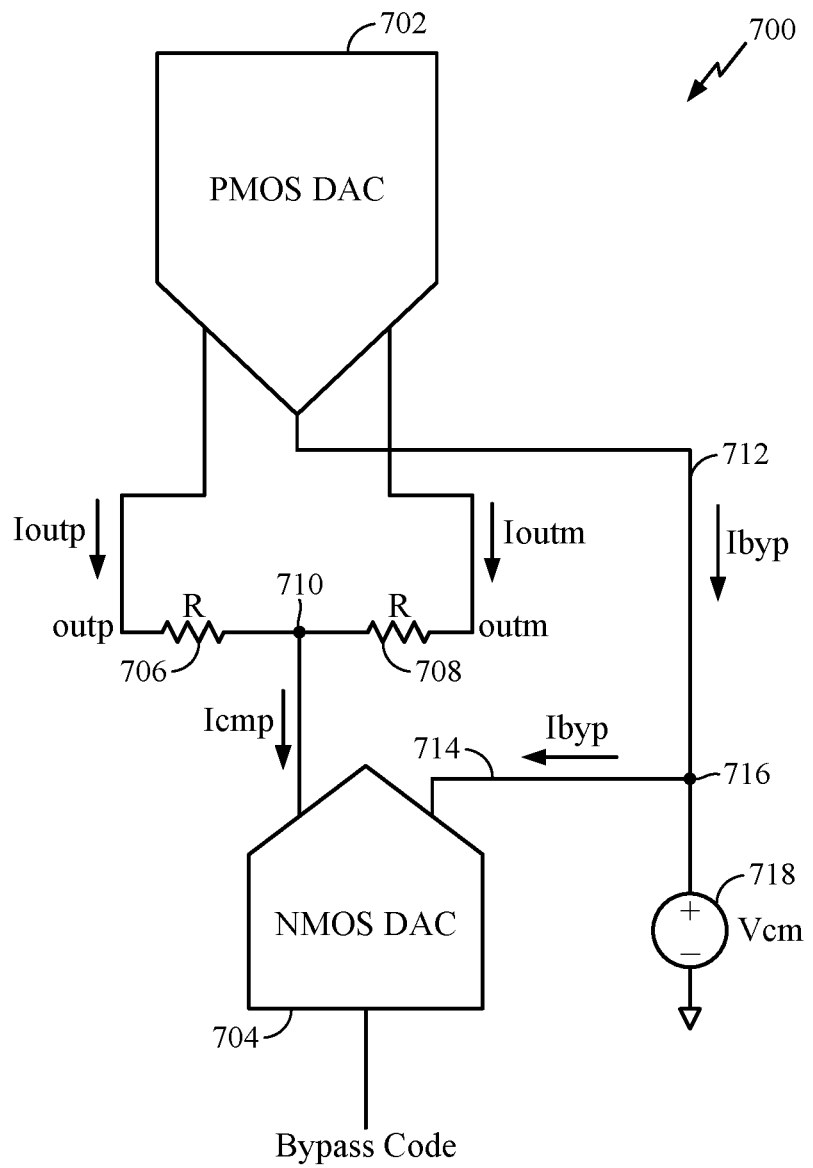
FIG. 7 is a circuit diagram illustrating a DAC for CM current compensation, in accordance with certain aspects of the present disclosure.

FIG. 7 is a circuit diagram 700 illustrating a PMOS DAC 702 coupled to an NMOS DAC 704 for CM current compensation, in accordance with certain aspects of the present disclosure. The NMOS DAC 704 may include switch arrays implemented using NMOS transistors that sink currents based on a DAC bypass code to generate a compensation current (Icompensation) sunk from node 710, as illustrated. Half of Icompensation (Icompensation/2) corresponds to the current 604 described with respect to FIG. 6. The operation of the NMOS DAC 704 is described in more detail with respect to FIG. 8.

Figure 8:
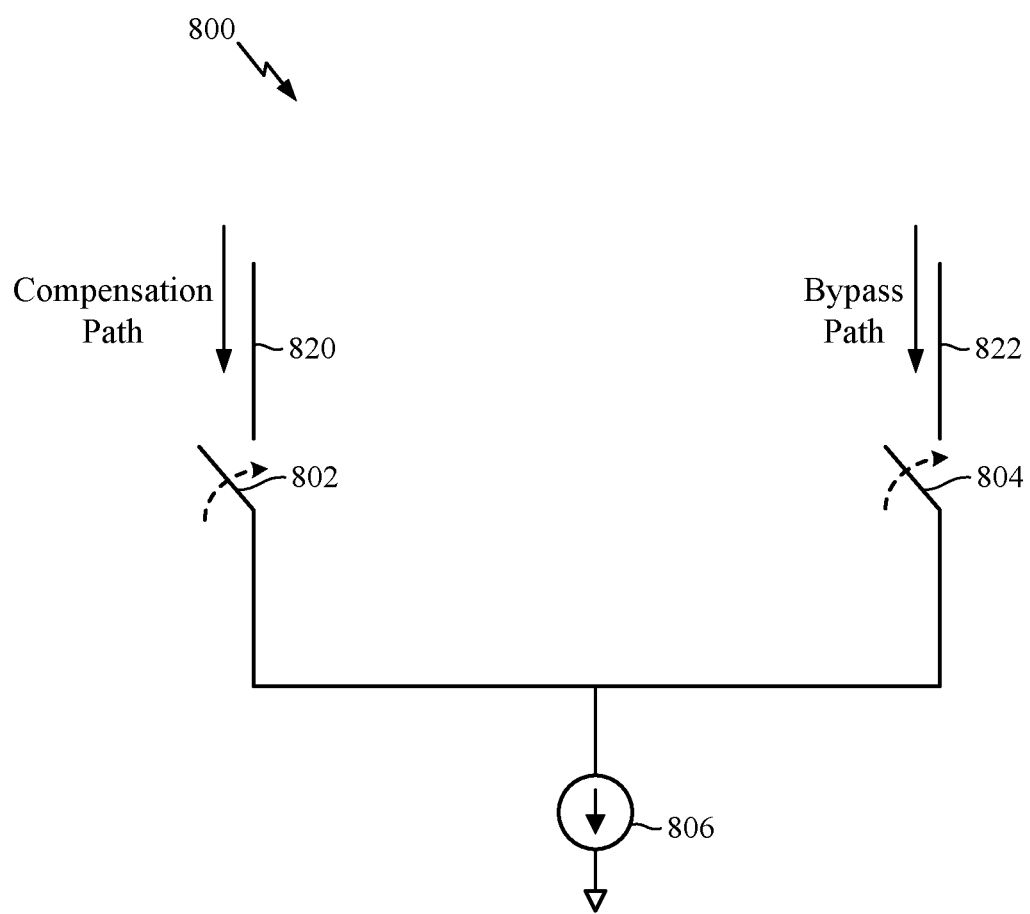
FIG. 8 illustrates an example switch array of a DAC for CM current compensation, in accordance with certain aspects of the present disclosure.

FIG. 8 illustrates an example switch array 800 of an NMOS DAC for CM current compensation, in accordance with certain aspects of the present disclosure. As illustrated, based on a bypass code, switches 802, 804 may be controlled to sink current from either the compensation path 820 or the bypass path 822. In other words, the bypass code may be set to generate a compensation current that is the inverse of the CM current (Icm) of the PMOS DAC 702, as described with respect to the graph 600.

As illustrated in FIG. 7, resistive elements 706, 708 may be coupled between the positive and negative output terminals (outp, outm) of the PMOS DAC 702. Icompensation generated by the NMOS DAC 704 is combined from currents flowing across the resistive elements 706, 708 having equal resistance R, effectively cancelling out (or at least reducing) the CM current of the PMOS DAC 702 as described with respect to FIG. 6. In other words, Icompensation may be sunk by the NMOS DAC 704 from node 710 between the resistive elements 706, 708. As illustrated, the bypass current (Ibyp) of the PMOS DAC 702 flows to a CM node 716, coupled to a CM voltage (Vcm) source 718, via the bypass path 712. Moreover, a bypass current may be sunk by the bypass path 714 of the NMOS DAC 704, as illustrated.

Figure 9:
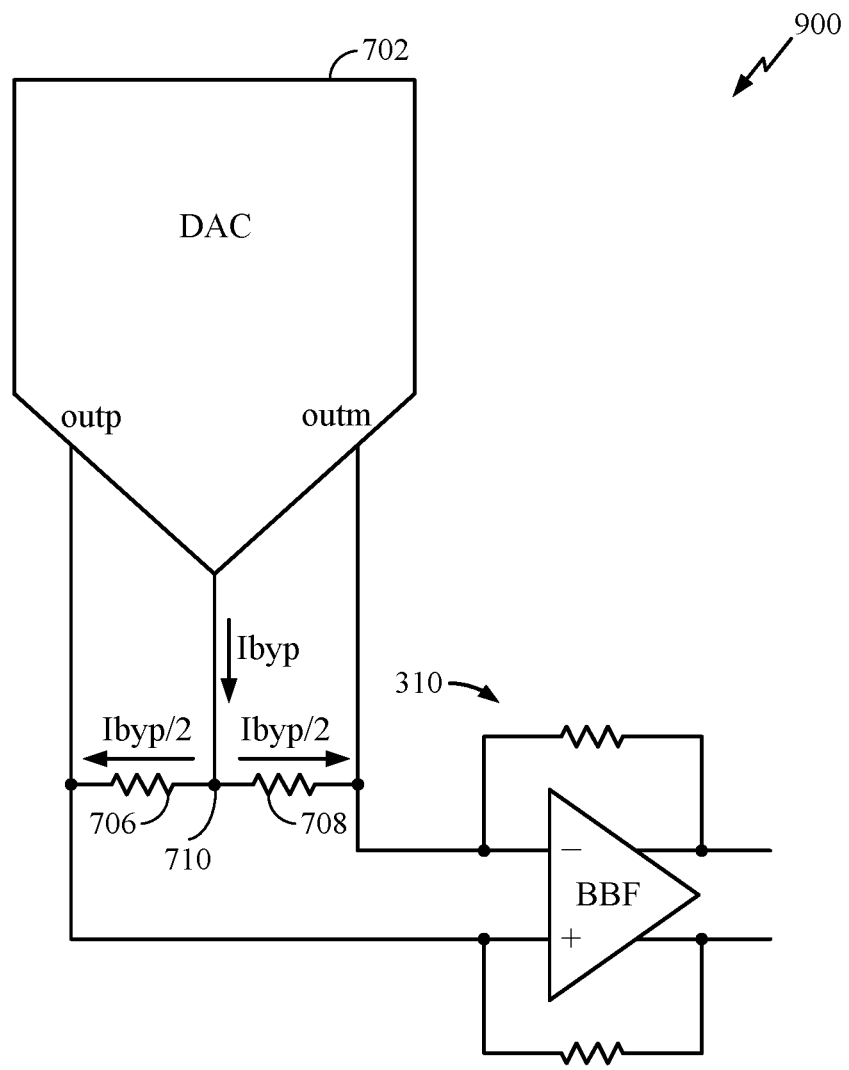
FIG. 9 is a circuit diagram illustrating a DAC with CM current compensation using a bypass path, in accordance with certain aspects of the present disclosure.

FIG. 9 is a circuit diagram 900 illustrating the PMOS DAC 702 with CM current compensation using a bypass path of the PMOS DAC 702, in accordance with certain aspects of the present disclosure. In this case, the bypass path of the PMOS DAC 702 may be coupled to the node 710 between the resistive elements 706, 708. Thus, the bypass current (Ibyp) may be split, each portion flowing across one of the resistive elements 706, 708, as illustrated. Thus, Ibyp may be used to effectively cancel out (or at least reduce) the CM current of the PMOS DAC 702, as described with respect to FIG. 10. Ibyp is used to remove (e.g., or at least reduce) the input code dependent CM current variation. That is, the CM current may no longer be code dependent with the configuration of the circuit diagram 900 when class AB operation is desired. As described in more detail with respect to FIG. 11, a current source (e.g., current source 1102) may be used to remove (or at least reduce) the CM current.

Figure 10:
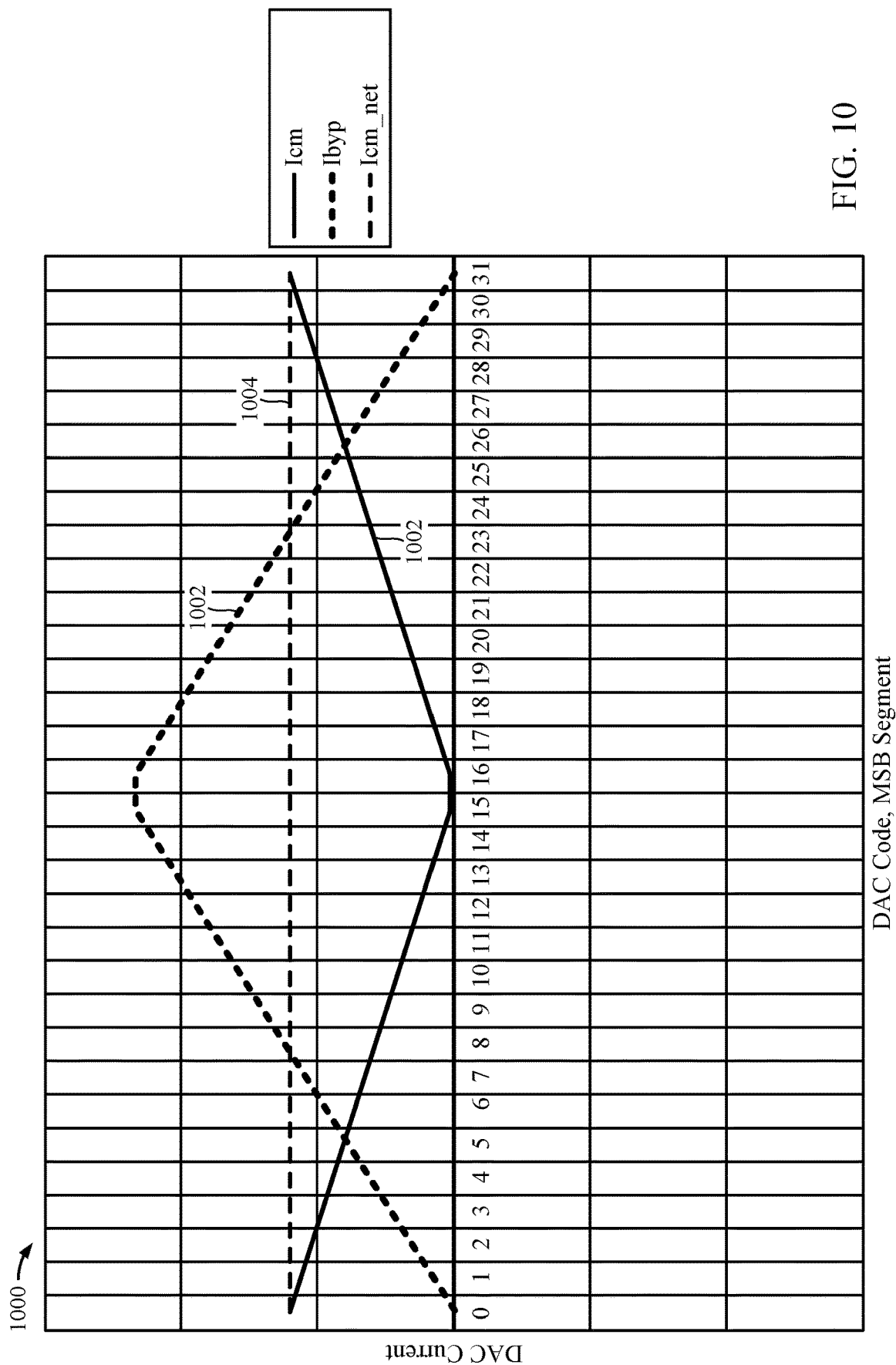
FIG. 10 is a graph illustrating a CM current, bypass current, and net CM current, in accordance with certain aspects of the present disclosure.

FIG. 10 is a graph 1000 illustrating the CM current 602 (Icm), bypass current 1002 (Ibyp), and the net CM current 1004 (e.g., Icm_net), in accordance with certain aspects of the present disclosure. As illustrated, half of the bypass current (Ibyp/2) flows across each of the resistive elements 706, 708 and is added to the CM current (Icm) of the positive and negative output paths, resulting in a net CM current 1004 that is constant, instead of being DAC-input-code-dependent.

Figure 11:
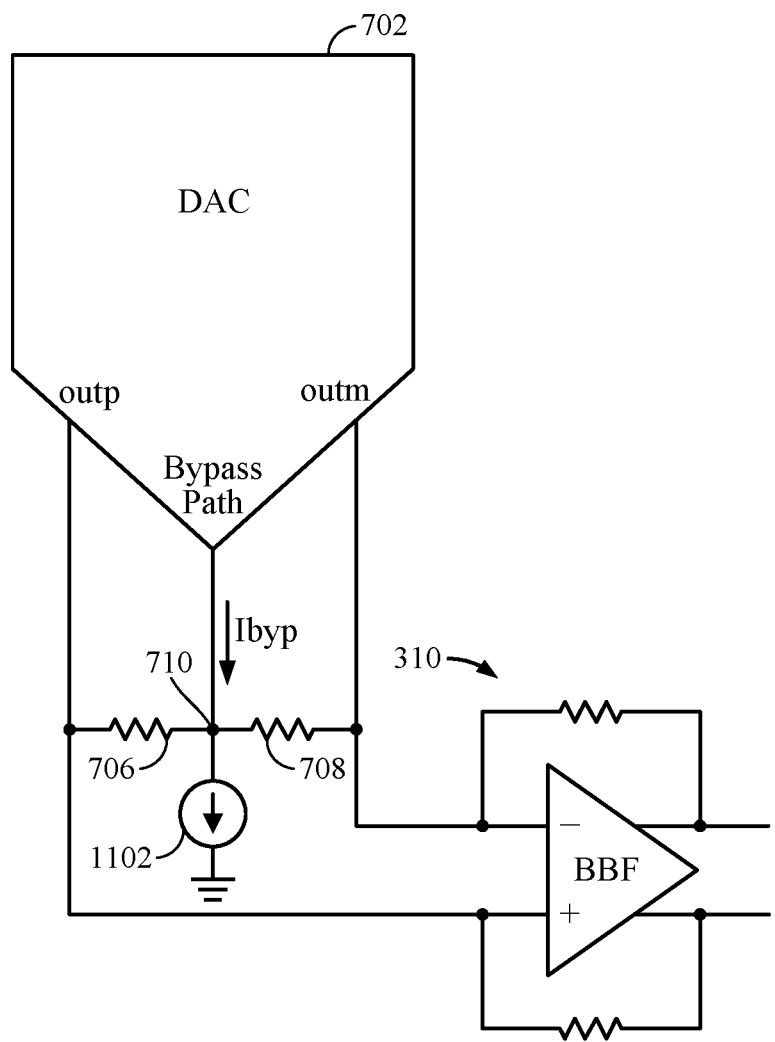
FIG. 11 illustrates a circuit diagram implemented with a current source to provide a net-zero CM current, in accordance with certain aspects of the present disclosure.

FIG. 11 illustrates the circuit diagram 900 implemented with a current source 1102 to provide a net-zero CM current, in accordance with certain aspects of the present disclosure. For example, the current source 1102 may sink a constant current from the node 710 that is twice the net CM current 1004 described with respect to FIG. 10. The current sunk by the current source 1102 effectively cancels out (or at least reduces) the net CM current 1004, resulting in a net-zero CM current for the PMOS DAC 702.

Figure 12:
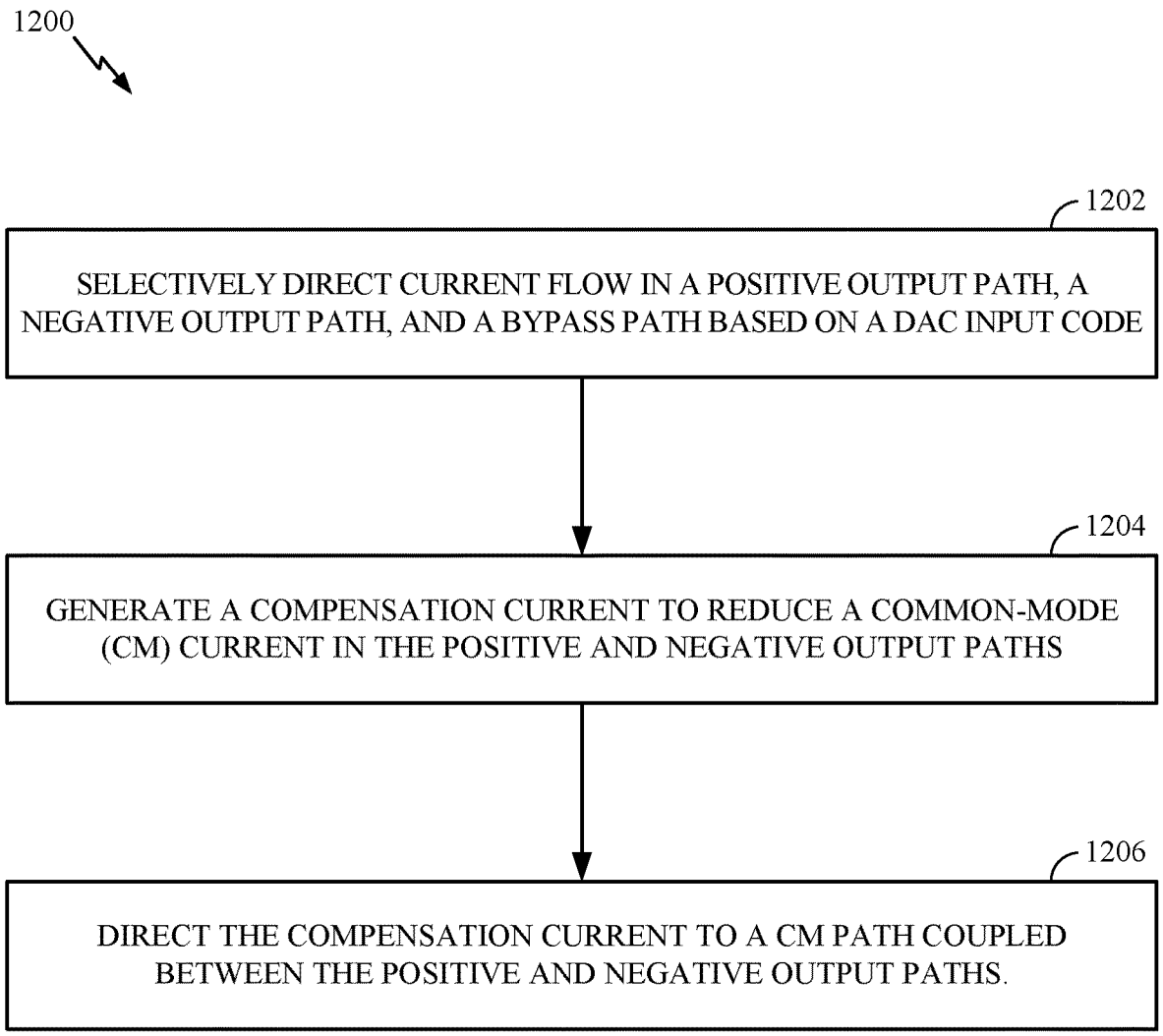
FIG. 12 is a flow diagram illustrating example operations for digital-to-analog conversion, in accordance with certain aspects of the present disclosure.

FIG. 12 is a flow diagram illustrating example operations 1200 for digital-to-analog conversion, in accordance with certain aspects of the present disclosure. The operations may be performed by a DAC system, such as the circuits described with respect to FIGS. 4-11.

The operations 1200 begin, at block 1202, by selectively directing (e.g., sourcing) current flow (e.g., input current Iin as described with respect to FIG. 4) in a positive output path, a negative output path, and a bypass path based on a DAC input code. At block 1204, a compensation current (e.g., Icompensation as described with respect to FIG. 7 or the bypass current in the bypass path as described with respect to FIGS. 9 and 11) may be generated to reduce a CM current (e.g., Icm as described with respect to FIGS. 6 and 10) in the positive and negative output paths, and at block 1206, directing the compensation current to a CM path (e.g., CM path including resistive elements 706, 708) coupled between the positive and negative output paths.

In certain aspects, selectively directing the current flow in the positive output path, the negative output path, and the bypass path may include selectively sourcing the current flow in the positive output path, the negative output path, and the bypass path. In some cases, the compensation current may be in a compensation path. In this case, generating the compensation current involves selectively directing (e.g., sinking) other current flow (e.g., current flow generated by current source 806) in the compensation path and another bypass path based on another DAC input code.

In certain aspects, the compensation current may be generated via the bypass path. In this case, bypass current in the bypass path may be sourced to the CM path. The operations 1200 may also include generating another compensation current (e.g., current sunk by current source 1102), and sinking the other compensation current from the CM path.

In certain aspects, the operations 1200 may also include splitting the compensation current to generate a first portion of the compensation current and a second portion of the compensation current. In this case, the first portion may flow to the positive output path via the CM path (e.g., across resistive element 706), and the second portion may flow to the negative output path via the CM path (e.g., across resistive element 708).

Certain aspects of the present disclosure have described a DAC which has code-dependent thermal noise from the MSB array. For example, a PMOS DAC is described herein that generates a bypass current provided to a bypass path, causing a variable CM current for the PMOS DAC. A complementary DAC (e.g. an NMOS DAC) may be implemented to adjust the variable CM current and provide a constant CM current for the digital-to-analog conversion system described herein.

The various operations of methods described above may be performed by any suitable means capable of performing the corresponding functions. The means may include various hardware component(s) and/or module(s), including, but not limited to one or more circuits. Generally, where there are operations illustrated in figures, those operations may have corresponding counterpart means-plus-function components with similar numbering. In certain aspects, means for selectively directing current flow may include one or more switches, such as the switches 402, 404, 406. In certain aspects, means for generating may include a DAC, such as the NMOS DAC 704, or a bypass path, such the bypass path coupled to the switch 406.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules, and circuits described in connection with the present disclosure may be implemented or performed with discrete hardware components designed to perform the functions described herein.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A digital-to-analog converter (DAC) system, comprising:
    a first current-steering DAC having a positive output, a negative output, and a bypass output;
    a common-mode (CM) path coupled between the positive and negative outputs; and
    a CM current compensation path coupled to the CM path.

2. The DAC of claim 1, further comprising a second current-steering DAC coupled to the CM current compensation path.

3. The DAC system of claim 2, wherein:
    the first current-steering DAC is configured as a p-channel metal-oxide semiconductor (PMOS) DAC; and
    the second current-steering DAC is configured as an n-channel metal-oxide semiconductor (NMOS) DAC.

4. The DAC system of claim 3, wherein the NMOS DAC is configured to sink a compensation current from the CM path via the CM current compensation path to reduce CM current flow in a negative output path coupled to the negative output and a positive output path coupled to the positive output.

5. The DAC of claim 2, wherein:
    the first current-steering DAC comprises first switches configured to selectively direct current flow in a positive output path coupled to the positive output, a negative output path coupled to the negative output, and a bypass path coupled to the bypass output; and
    the second current-steering DAC comprises second switches configured to selectively direct other current flow in the CM current compensation path and another bypass path.

6. The DAC system of claim 5, wherein:
    the first switches comprise p-channel metal-oxide semiconductor (PMOS) transistors configured to selectively source the current flow to the positive, negative, and bypass paths, the first current-steering DAC being configured as a PMOS DAC; and
    the second switches comprise n-channel metal-oxide semiconductor (NMOS) transistors configured to selectively sink the other current flow from the CM current compensation path and the other bypass path, the second current-steering DAC being configured as an NMOS DAC.

7. The DAC system of claim 2, wherein:
the CM path comprises a first resistive element and a second resistive element, the CM current compensation path being coupled to a node between the first resistive element and the second resistive element.

8. The DAC system of claim 1, wherein the CM current compensation path is coupled to the bypass output of the first current-steering DAC.

9. The DAC system of claim 8, wherein:
the CM path comprises a first resistive element and a second resistive element, the bypass output being coupled to a node between the first resistive element and the second resistive element.

10. The DAC system of claim 8, further comprising a current source coupled to the CM path.

11. The DAC system of claim 10, wherein:
the first current-steering DAC is configured to source a bypass current to the CM compensation path via the bypass output; and
the current source is configured to sink a compensation current from the CM path.

12. The DAC system of claim 1, wherein the CM current compensation path is configured to sink a compensation current from the CM path to reduce a CM current flow in a positive output path coupled to the positive output and a negative output path coupled to the negative output.

13. A method for digital-to-analog conversion (DAC), comprising:
selectively directing current flow in a positive output path, a negative output path, and a bypass path based on a DAC input code;
generating a compensation current to reduce a common-mode (CM) current in the positive and negative output paths; and
directing the compensation current to a CM path coupled between the positive and negative output paths.

14. The method of claim 13, wherein selectively directing the current flow in the positive output path, the negative output path, and the bypass path comprises:
selectively sourcing the current flow in the positive output path, the negative output path, and the bypass path.

15. The method of claim 13, wherein the compensation current is in a compensation path, and wherein generating the compensation current comprises selectively directing other current flow in the compensation path and another bypass path based on another DAC input code.

16. The method of claim 15, wherein:
selectively directing the current flow in the positive output path, the negative output path, and the bypass path comprises selectively sourcing the current flow in the positive output path, the negative output path, and the bypass path; and
selectively directing the other current flow in the compensation path and the other bypass path comprises selectively sinking the other current flow in the compensation path and the other bypass path.

17. The method of claim 13, wherein the compensation current is generated via the bypass path.

18. The method of claim 17, wherein bypass current in the bypass path is sourced to the CM path, the method further comprising:
generating another compensation current; and
sinking the other compensation current from the CM path.

19. The method of claim 13, wherein:
the method further comprises splitting the compensation current to generate a first portion of the compensation current and a second portion of the compensation current;
the first portion flows to the positive output path via the CM path; and
the second portion flows to the negative output path via the CM path.

20. An apparatus for digital-to-analog conversion (DAC), comprising:
means for selectively directing current flow in a positive output path, a negative output path, and a bypass path based on a DAC input code; and
means for generating a compensation current to reduce a common-mode (CM) current component of the current flow in the positive and negative outputs, the compensation current being directed to a CM path between the positive and negative output paths.

* * * * *